(12) United States Patent
Ramon

(10) Patent No.: US 6,184,048 B1
(45) Date of Patent: Feb. 6, 2001

(54) TESTING METHOD AND APPARATUS ASSURING SEMICONDUCTOR DEVICE QUALITY AND RELIABILITY

(75) Inventor: Joseph Ramon, Dallas, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/433,174

(22) Filed: Nov. 3, 1999

Related U.S. Application Data

(60) Provisional application No. 60/106,837, filed on Nov. 3, 1999.

(51) Int. Cl.[7] ............................. G01R 31/26; H01L 21/66
(52) U.S. Cl. .................... 438/14; 438/10; 438/17; 438/18; 438/19; 324/522
(58) Field of Search .................... 438/14, 17, 18, 438/19, 5, 10; 364/468, 17; 324/522; 371/28

(56) References Cited

U.S. PATENT DOCUMENTS 5,497,381 * 3/1996 O'Donoghue et al. .............. 371/28
6,013,533 * 1/2000 Sugasawara et al. ............... 438/17

* cited by examiner

*Primary Examiner*—Charles Bowers
*Assistant Examiner*—Hsien-Ming Lee
(74) *Attorney, Agent, or Firm*—David T. Denker; Wade James Brady, III; Frederick J. Telecky, Jr.

(57) ABSTRACT

A method for assuring quality and reliability of semiconductor integrated circuit devices, fabricated by a series of documented process steps, comprising first, electrically testing the devices outside their specified operating voltage range, yet within the capabilities of the structures produced by the process steps, thereby generating raw electrical test data; second, comparing the test data to values expected from the design of the devices, thereby providing non-electrical characterization of the devices to verify compositional and structural features; and third, correlating the features with the documented process steps to find deviations therefrom, as well as structural defects, thereby identifying outlier devices. After eliminating the outlier devices, the accepted devices do no longer have to undergo the traditional burn-in process.

18 Claims, 6 Drawing Sheets

FIG. 1

| DETECTING OUTLIERS | | TESTS |
|---|---|---|
| MULTI-PROBE OUTLIERS | OUTLIER CHIPS | • VDD VOLTAGE BOX : ULTRA HIGH VDD ("STRESS") ULTRA LOW VDD<br>• IDDQ SCREEN AT $\begin{cases} \text{VDD MAX} \\ \text{VDD MIN} \end{cases}$ + IDDQ INTERPOLATION<br>• INPUT LEAKAGE<br>• PARAMETRIC TEST FOR DEVICES HAVING OUTLIER LIMITS<br>• PARAMETERS WITH LOW CPK (I-DRIVE)<br>• CONTINUITY<br>• SHORTS<br>• HIGH VALUES/LOW VALUES OF INPUT/OUTPUT VOLTAGE<br>• LOW SPEED FUNCTIONAL TESTS<br>• LOW VOLTAGE TEST AT HIGH SPEED (HIGH SPEED CLOCK) |
| | OUTLIER WAFERS | • > 5 TO 8% IDDQ FAILURES<br>• BURN-IN AND SPECIAL ASSEMBLY |
| | OUTLIER WAFER LOTS | • > 25%<br>• BURN-IN AND SPECIAL ASSEMBLY |
| ASSEMBLY OUTLIERS | | • CONTINUITY + OPEN<br>• FUNCTIONAL<br>• PARAMETRIC |

TESTING METHOD AND APPARATUS ASSURING SEMICONDUCTOR DEVICE QUALITY AND RELIABILITY

This application claims priority under 35 USC §119(e)(1) of provisional application Ser. No. 60/106,837 filed 11/03/1999.

FIELD OF THE INVENTION

The present invention is related in general to the field of semiconductor devices and testing and more specifically to a testing methodology assuring device quality and reliability without conventional burn-in while using a low-cost tester apparatus.

DESCRIPTION OF THE RELATED ART

W. Shockley, the inventor of the transistor and Nobel prize winner, demonstrated in the late '50s and early '60s the effect of fabrication process variations on semiconductor device performance; he specifically explored the dependence of the p-n junction breakdown voltage on local statistical variations of the space charge density; see W. Shockley, "Problems Related to p-n Junctions in Silicon", Solid-State Electronics, vol. 2, pp. 35–67, 1961.

Since that time, numerous researchers have investigated semiconductor integrated circuit (IC) process steps to show that each process step has its design window, which in most cases follows a Gaussian bell-shaped distribution curve with unavoidable statistical tails. These researchers have illuminated how this statistical variation affects the performance characteristics of semiconductor devices, and how to keep the processes within a narrow window. The basis for determining the process windows was in most cases careful modeling of the process steps (such as ion implantation, diffusion, oxidation, metallization, junction behavior, effect of lattice defects and impurities, ionization, etc.); see for example reviews in F. van de Wiele et al., "Process and Device Modeling for Integrated Circuit Design", NATO Advanced Study Institutes Series, Noordhoff, Leyden, 1977. Other modeling studies were addressing the simulation of circuits directly; see, for example, U.S. Pat. No. 4,744,084, issued May 10, 1988 (Beck et al., "Hardware Modeling System and Method for Simulating Portions of Electrical Circuits").

Today, these relationships are well known to the circuit and device designers; they control how process windows have to be designed in order to achieve certain performance characteristics and device specifications. Based on these process parameters, computer simulations are at hand not only for specification limits, but within full process capability so that IC designs and layouts can be created. These "good" designs can be expected to result in "good" circuits whenever "good" processes are used in fabrication; device quality and reliability are high. Based on testing functional performance, computer-based methods have been proposed semiconductor device conformance to design requirements. See, for example, U.S. Pat. No. 5,688,745, issued Sep. 16, 1997 (Day, "Method and Apparatus for Testing Semiconductor Devices").

However, when a process is executed during circuit manufacturing so that it deviates significantly from the center of the window, or when it is marginal, the resulting semiconductor device may originally still be within its range of electrical specifications, but may have questionable long-term reliability. How can this be determined? The traditional answer has been the so-called "burn-in" process. This process is intended to subject the semiconductor device to accelerating environmental conditions such that the device parameters would show within a few hundred hours what would happen in actual operation after about 2 years.

In typical dynamic burn-in, circuit states are exercised using stuck-fault vectors. The accelerating conditions include elevated temperature (about 140° C.) and elevated voltage (Vdd about 1.5×nominal); the initial burn-in is for 6 hr, the extended burn-in is 2 sets of 72 hr, with tests after each set. Since 6 hr burn-in is equivalent to 200 k power-on hours, device wearout appears early, the reliability bathtub curve is shortened, and the effect of defects such as particles will be noticed.

There are several types of defects in ICs, most of which are introduced during the manufacturing process flow. In the last three decades, these defects have been studied extensively; progress is, for example, reported periodically in the Annual Proceedings of the IEEE International Reliability Physics Symposium and in the reprints of the Tutorials of that Symposium.

In the so-called bathtub curve display, the number of failures is plotted versus time. The initial high number of failures is due to extrinsic failures, such as particulate contamination, and poor process margins. The number of failures drops sharply to the minimum of intrinsic failures and remains at this level for most of the device lifetime. After this instantaneous or inherent failure rate, the number of failures increases sharply due to wearout mortality (irreversible degradation such as metal electromigration, dielectric degradation, etc.).

Based on functional tests and non-random yields, automated methods have been proposed to analyze defects in IC manufacturing and distinguish between random defects and systematic defects. See, for example, U.S. Pat. No. 5,497,381, issued Mar. 5, 1996 (O'Donoghue et al., "Bitstream Defect Analysis Method for Integrated Circuits")

For burn-in, the devices need facilities equipped with test sockets, electrical biasing, elevated temperature provision, and test equipment. Considering the large population of devices to be burned-in, the expense for burn-in is high (floor space, utilities, expensive high-speed testers for final device test, sockets, etc.). As an example of a proposal to avoid burn-in, see J. A. van der Pol et al., "Impact of Screening of Latent Defects at Electrical Test on the Yield-Reliability Relation and Application to Burn-in Elimination", 36th Ann. Proc. IEEE IRPS, pp. 370–377, 1998. It is proposed that voltage stresses, distribution tests and Iddq screens are alternatives to burn-in, but the tests cover only device specification and are thus too limited and expensive.

An additional concern is the effect burn-in has on the devices which are subjected to this procedure. After the process, many survivors are "walking wounded" which means that their probable life span may have been shortened to an unknown degree.

In addition to the greatly increased cost for burn-in, the last decade has seen an enormous cost increase for automatic testing equipment. Modern high-speed testers for ICs cost in excess of $ 1 million, approaching $ 2 million. They also consume valuable floor space and require considerable installation (cooling) effort. These testers not only have to perform the traditional DC parametric device tests, but the ever more demanding functional and AC parametric tests. DC parametric tests measure leakage currents and compare input and output voltages, both of which require only modest financial investment. Functional tests are based on the test pattern of the device-to-be-tested, a tremendous task for the rapidly growing complexity of modern ICs. AC parametric tests measure speed, propagation delay, and signal rise and fall. These tests are combined to "at speed" functional tests. For the required timing control, calibration, and many patterns at high speed, the lion share of the financial investment is needed (between 80 and 95%). Included here are the pattern memory and timing for stimulus and response, format by combining timing and pattern memory, serial shift registers (scan), and pattern sequence controller.

Traditional automatic test equipment (ATE) incorporates expensive, high performance pattern memory sub-systems to deliver complex test patterns during production test of digital ICs. These subsystems are designed to deliver wide patterns (typically 128 to 1024 bits) at high speeds (typically 20 to 100's MHz, more than 400 MHz on new devices). The depth of the pattern storage is typically 1 to 64 million. The width, speed and depth of the pattern memory requirements, along with the sequencing capability (loops, branches, etc.) combine to significantly affect the cost of the pattern subsystem, to the extent that most pattern subsystems represent a significant component of the overall ATE cost.

The traditional pattern memory subsystem limitations are often the source of test program development problems and initial design debug inefficiencies. The number of test patterns required is proportional to the number of transistors in a device. As the device integration rapidly progresses, the corresponding test pattern requirements will present increasingly difficult challenges for cost effective traditional pattern memory subsystems.

In summary, the goal of avoiding the expensive burn-in procedure and replacing it by a low-cost, fast, reliable and flexible procedure has remained elusive, until now. An urgent need has, therefore, arisen for a coherent approach to both a low-cost method and a low-cost testing equipment offering a fundamental solution not only to avoid burn-in, but to guarantee quality and reliability of semiconductor devices in general, and to achieve these goals with testers of much reduced cost. The method should be flexible enough to be applied for different semiconductor product families and a wide spectrum of design and process variations and should lend itself as a guiding tool during wafer fab processing as well as after testing at multiprobe and after assembly and packaging. The method and the testers should increase manufacturing throughput and save floor space, time and energy. Preferably, these innovations should break the stranglehold of cost increases for fast testers which are today a significant part of the skyrocketing cost of IC device production, and expedite the time-to-market required for new IC products.

SUMMARY OF THE INVENTION

The present invention provides a testing method and apparatus assuring IC device quality and reliability by testing yield based on process capability and not yield based on device specifications. With this fundamental change in test methodology, burn-in can be eliminated or reduced to a few percent of the product volume having questionable characteristics, and the cost of testers is reduced to about 5% of today's high- speed tester cost. The levels of reliability are comparable to six-sigma levels (the six-sigma methodology is defined in relation to specifications).

The method for assuring quality and reliability of IC devices, fabricated by a series of documented process steps, comprises first functionally testing the devices outside their specified voltage range, yet within the capabilities of the fabrication process steps, then interpreting these electrical data to provide non-electrical characterization of the devices, thereby verifying their compositional and structural features, and finally correlating these features with the fabrication process steps to find deviations from the process windows, as well as structural defects.

The present invention can be applied to all Logic devices, specifically those made by CMOS technology, such as wireless products, hard disk drives, digital signal processors, application-specific devices, mixed-signal products, microprocessors, and general purpose logic devices. It can also be adapted to Memory products, and expanded to parallel imbedded testing, analog testing, and optimized JTAG/scan.

Based on the well-proven premise that good designs result in good products when good manufacturing processes are used, the present invention avoids the traditional method of at-speed functional testing and testing of propagation delays, and rather tests instead for so-called process "outliers", both of the systematic and the non-systematic kind. The outlier methodology verifies critical process parameters on each chip, such as voltage box for Vdd, tight Iddq, and leakage current, as opposed to conventional methodology which verifies electrical specification on each chip for each specified parameter.

The outlier methodology emphasizes logic testing including testing at-speed built-in self test (BIST), delay fault, I-drive, and wide voltage box. The tester of the present invention is capable of DC testing, including continuity, leakage current, Iddq, and logic testing, including slow functional tests, serial scan, algorithmic patterns (for Memory devices), delay path fault, and at-speed BIST. However, the tester of the present invention does not need traditional at-speed functional device testing.

Newer test methodologies, design-for-test (DFT) and BIST techniques are reducing the need to deliver test patterns at high speed to several classes of advanced logic devices. Relaxing traditional at-speed test requirements represents an opportunity to significantly reduce the cost of ATE. However, even with reduced pattern speed requirements, the depth, width and complexity of the required pattern sequences can still have a significant impact on the architecture and cost of the ATE. The invention takes advantage of the potentially lower pattern speed requirements of devices compatible with newer test methodologies, DFT or BIST techniques, by eliminating the need for a traditional pattern memory subsystem, thereby avoiding a significant component of ATE cost.

In one embodiment of the present invention, the (relatively low cost) workstation or general purpose computer controlling the tester is used as a "virtual" pattern memory system. In this function, the computer stores and delivers digital test patterns and thus replaces the (expensive) pattern sequence controller (pattern memory sub-system) in traditional testers. The workstation is needed for other tester control functions anyway, so it represents no added cost.

In an embodiment of the invention, the tester controller is a high performance work station providing user interface, factory connectivity, as well as tester control. The workstation uses "virtual" memory for program and data storage. Test patterns are stored in the workstation memory as direct memory access (DMA) blocks, and transferred to the device under test (DUT) for digital stimulus and response comparison, as needed, during production testing. Although the pattern data is not transferred "at speed" to the DUT, the use of DMA techniques ensures that the patterns are transferred as efficiently as possible, in order to minimize test time.

In a specific embodiment of the invention, the pattern bits stored in the tester controller are executed as a stream of DMA blocks in order to generate the traditional parallel pattern simultaneously applied to the device-under-test.

Since the workstation's memory is "virtual", the test pattern depth is no longer constrained by traditional pattern memory subsystem costs and limitations, avoiding difficult cost/limitation tradeoff decisions.

In another embodiment of the invention, only the changes between patterns have to be stored and loaded. This feature makes pattern storage much more efficient. In contrast, traditional pattern memory systems store all digital information for all pins for each pattern, even though only a small percentage of the total information changes from pattern to pattern. This increases storage requirements and increases the amount of time needed to compile and load pattern information into the tester.

In yet another embodiment of the invention, the workstation capability to create execution flexibility is exploited to avoid the cost/limitation tradeoff of traditional pattern memory systems due to dedicated hardware. Conventionally, loops, repeats, branches, subroutines, etc. are limited by the architecture and cost of the pattern memory subsystem hardware. In contrast, according to the invention, the pattern sequences are controlled by the workstation software. The only limit to pattern execution flexibility is software execution overhead. This overhead, however, is generally small with respect to the total pattern execution time in this application.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE VIEWS OF THE DRAWINGS

FIG. 1 list the tests performed according to the outlier methodology of the invention at IC wafer multiprobe and at final device probe.

DETAILED DESCRIPTION OF THE PREFERRED EMBODIMENTS

Figure 2:
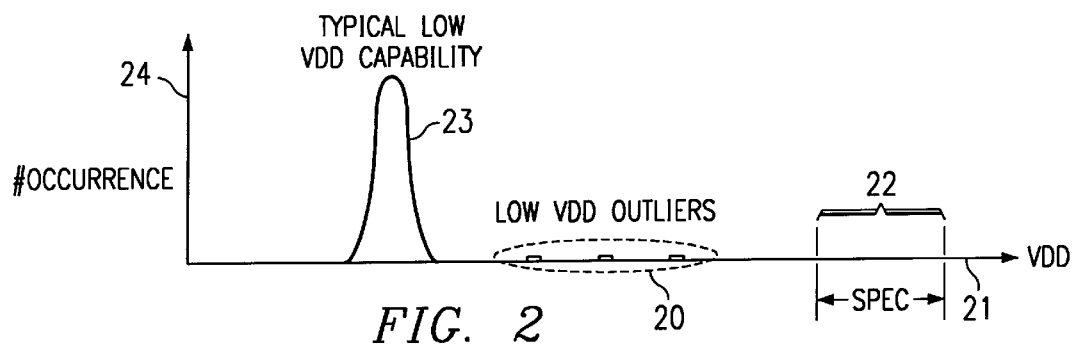
FIG. 2 shows the Vdd outliers as a detail of the Vdd test of the invention.

Proven good circuit designs will deliver product with the expected performance characteristics if and when the processes employed in production are within their defined process windows. However, in real manufacturing, systematic and non-systematic process "outliers" may deliver product with questionable quality. As defined herein, an "outlier" is defined as the portion of the distribution that lies outside the normal level of variation. An "outlier" is the value that lies unusually far from the main body of the data. According to the invention, outliers are no longer screened by the burn-in procedure, but by electrical tests at circuit multiprobe, and at device final test.

At multiprobe testing, outliers are detected so that they can be attributed to three levels:

outlier chips, outlier wafer, and outlier wafer lots.

In FIG. 1, the tests performed for finding outlier chips are tabulated in two sections: The special tests introduced by the invention, and additional normal tests adopted by the outlier methodology. The special tests include ultra extreme Vdd tests, Iddq tests, and input leakage tests.

Special Tests For Identifying Outlier Chips

Ultra Extreme Vdd Tests

In CMOS device specifications, Vdd values, the voltage supplied to the drain, are typically bracketed by a low and a high value, defining the Vdd voltage box. For example, for a 5 V digital signal processor device, the specification of the Vdd box may be defined by a low value of Vdd min=4.75 V and a high value of Vdd max=5.25 V. According to the invention, however, the detection of outliers requires more extreme values: Vdd ult min=3.0 V, Vdd ult max=8.0 V. These ultra extremes define the Vdd tests for detecting outliers.

Ultra High Vdd Margin

As defined herein, the voltage Vdd and the current Idd refer to the power input of CMOS devices; Iddq refers to the quiescent or leakage current of the drain current Idd.

By applying the ultra high Vdd stress, it is possible to break down marginal transistor oxides or intra/inter-level oxides, thereby creating parasitic currents measurable as Iddq. These defects cause time-dependent failure mechanisms which can be screened out by measuring Iddq. The type of failures eliminated by this test may be particle induced, or may be due to poor intrinsic process margins (faults such as filaments or residue).

Consequently, the high Vdd stress test comprises first applying the ultra high Vdd and then measuring Iddq. In several product families, it was found that approximately 80% of all burn-in failures can be detected by the high Vdd stress followed by an Iddq screen.

Ultra Low Vdd Margin

Temperature activated failure mechanisms cannot be found by ultra high Vdd stress followed by Iddq testing. In this problem category fall, for instance, marginal via connections, weak contact, and marginal p-n junctions. According to the invention, these potential failure mechanisms can be found by characterizing the ICs at ultra low Vdd, categorizing outliers as falling outside "typical low Vdd" values, and eliminating those statistically suspect products.

In FIG. 2, the low Vdd outliers 20 are located on the Vdd axis 21 relative to the Vdd specification range 22 and the typical low Vdd process capability 23. The ordinate 24 plots the number of occurrences. Devices having low Vdd values in the outlier range 20 are suspect of reliability problems and are, therefore, either to be discarded or subjected to conventional burn-in processes.

Quiescent Current Iddq Tests

Figure 3:
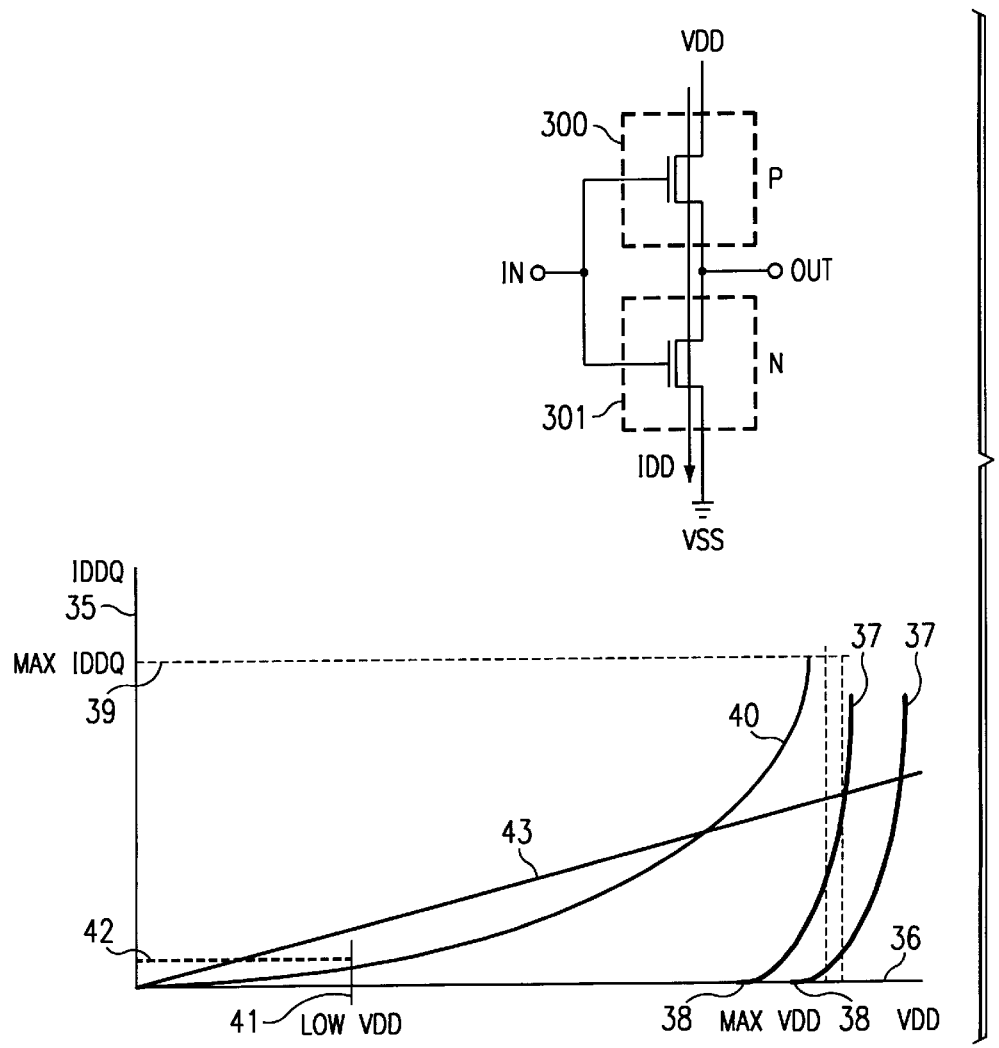
FIG. 3 shows the Iddq test and its interpretation within the outlier methodology.

In FIG. 3, the quiescent current Iddq of the drain current Idd is plotted (axis 35) as a function of the voltage Vdd applied to the drain of CMOS transistors (axis 36). Normal Iddq curves traces have reference numbers 37. They exhibit negligible Iddq values up to high Vdd voltages 38. At max Vdd +0.5 V, max Iddq (39 in FIG. 3) should be computed for Iddq mean +4 sigma. Typically, max Iddq is between 10 and 100 $\mu$A.

In a static design, as shown in the insert of FIG. 3, of a P transistor 300 and a N transistor 301 in series, whenever either one of the transistors is off, there should be no conductive path between Vdd and Vss; no current Idd should flow. However, if any current is observed, it is the result of a faulty off-transistor.

During Iddq test, the leakage of all the inverters of a circuit are measured in parallel. This current should be on the $\mu$A range provided:

there is no conductive path in the circuit design;

no single transistor, when in the off state, draws any current.

What complicates this test are the facts that not all designs have a completely non-conductive regime during when in the off state, and that in new technologies, which aim at achieving ever higher speed, transistors have become leaky. An example of such leaky characteristic is indicated in FIG. 3 by curve 40. These facts, in turn, drive high Iddq values at maximum specified Vdd voltage and make it impossible, therefore, to detect an abnormal leakage path, which is generally in the range of a few $\mu$A and will thus be just "noise" in the 10 to 100 $\mu$A of the total Iddq of the device.

In order to remedy this dilemma, the methodology of the invention reduces the voltage Vdd at which Iddq is measured so that the normal high currents of the transistors are avoided and a tight Iddq limit can be applied. The low Vdd (41 in FIG. 3) should be selected to have Iddq +4 sigma <1 $\mu$A (42 in FIG. 3), or other outlier limit.

Furthermore, the Iddq readpoints at high Vdd and low Vdd are interpolated. They should not fall on a linear curve through the origin (43 in FIG. 3). However, if they do, then a parasitic resistance is indicated which strongly suggests a process-related problem.

Input Leakage Tests

While device input leakage currents of about 10 $\mu$A are conventionally specified, the methodology of this invention reduces the acceptable limit to about 70 $\mu$A. Devices with substantially higher leakage currents are classified as outliers.

Furthermore, the drive current of transistors in the on-state ("I-drive") has to be measured, as well as parameters with low Cpk. This number, used for characterizing process capability, compares the actually measured sigma distribution of parameters to the target distribution, especially relative to the centering of the distributions. A value of Cpk=2 is ideal, values of Cpk<1.5 are suspect of outliers. Simple parametric tests should control process parameters with low Cpk.

Additional Normal Tests Adopted For Identifying Outlier Chips

Figure 6:
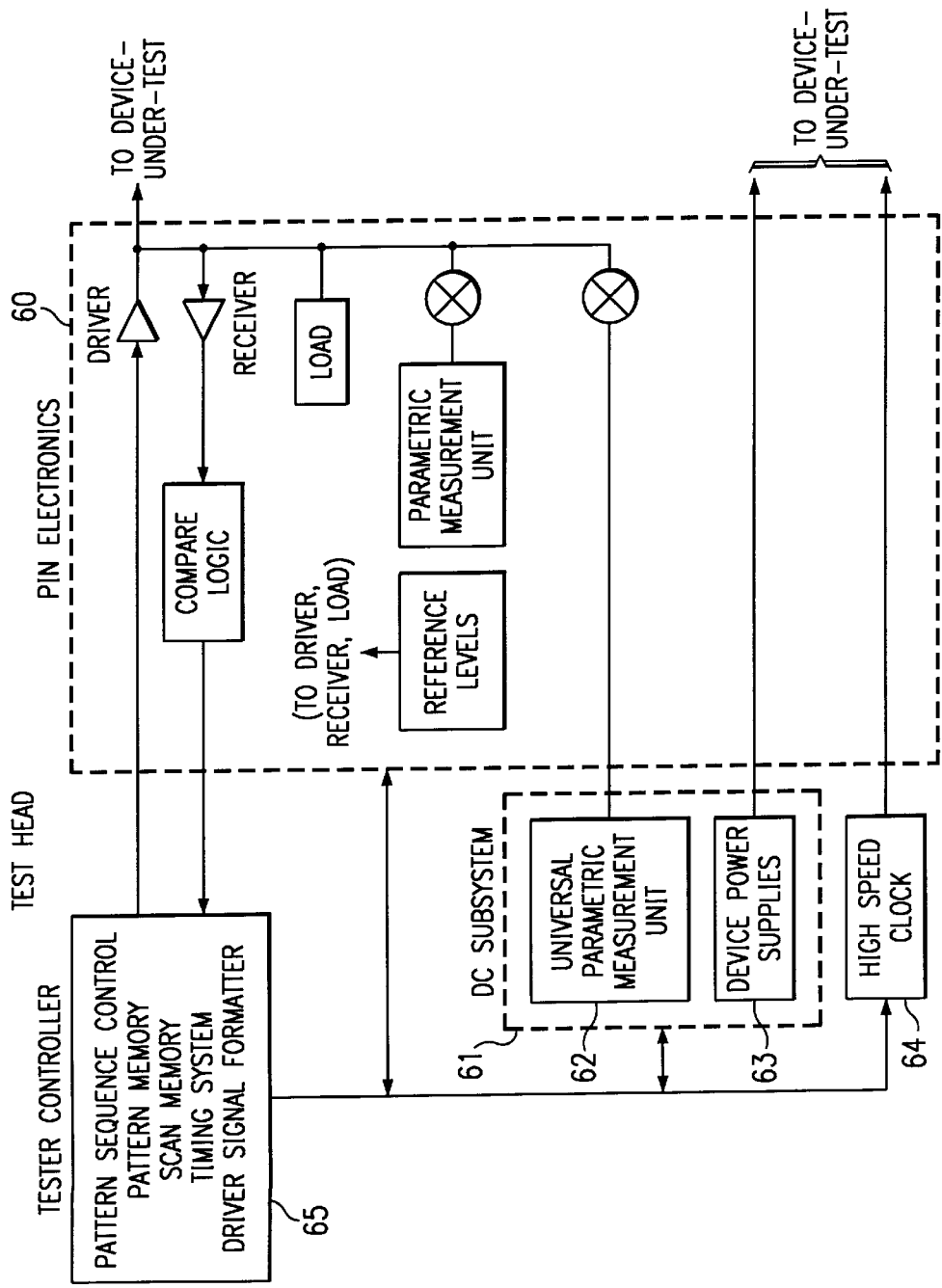
FIG. 6 is a simplified block diagram of the virtual function tester (VFT), a major embodiment of the invention.

In FIG. 1, the second section of tests performed for finding outlier chips are conventionally performed tests for meeting the specifications, which have been adopted by the outlier methodology of the invention. These tests comprise:

tests for electrical continuity;

tests for electrical shorts;

tests for the high values of input and output voltage and tests for the low values of input and output voltage;

low speed functional tests; and low voltage test at high speed, however without timing test, using a high speed clock (see below, apparatus of this invention and FIGS. 6, 7 and 8).

All of the above tests for identifying outlier chips are low-cost tests (performed by the low-cost apparatus of the invention, see below). Chips which have passed the above outlier tests do longer have to be burned-in, since experience has shown that they are guaranteed of good quality and high reliability. Chips which have failed the above outlier tests are not processed further through the assembly and packaging steps, but scrapped as products and submitted to failure analysis for identifying the root-cause of the defects and the manufacturing processes no longer within their process windows. It is a pivotal advantage of the present invention that the data of the electrical tests failed can be interpreted to provide non-electrical characterization of the failed circuits, leading to verification of compositional and structural features of the chips. By correlating these features with the documented fabrication process steps, deviations from the process windows as well as structural defects can be found.

Figure 4:
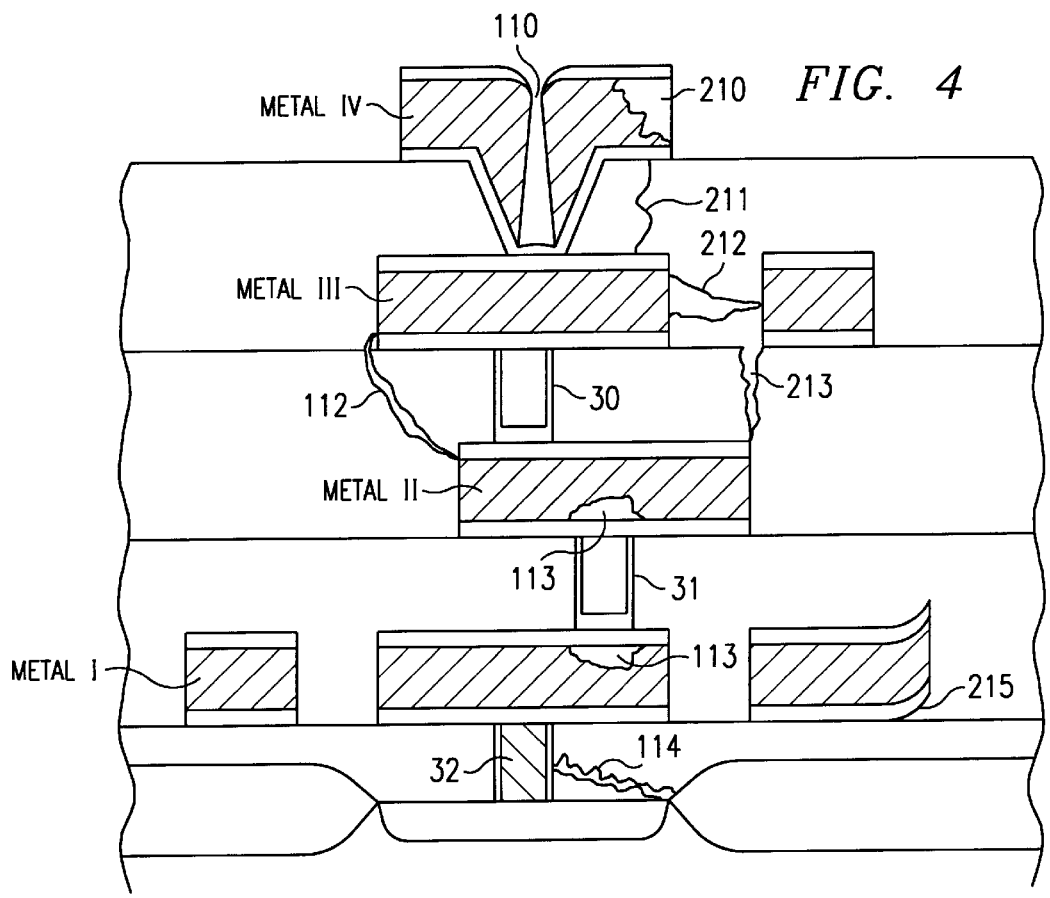
FIG. 4 summarizes schematically several reliability failure mechanisms of multi-level metal IC devices detected by the outlier methodology.

In FIG. 4, a number of electrical and thermomechanical defects and reliability failure mechanisms in multi-level metal ICs are schematically summarized which can be identified using the outlier methodology of the invention. On the left hand side are the electrical failure mechanisms, mostly caused by electromigration, on the right hand side the thermomechanical failure mechanisms, mostly caused by stresses. In the four levels of metallization, the top metal IV shows electromigration voiding 110 and stress voiding 210. Further, the protective overcoat has a crack 211. Metal III exhibits a metal side hillock 212, causing shorting between line portions of this metallization. Electromigration causes the interlevel shorting 112 from metal III to metal II, bypassing the via connection 30. Further, the interlevel insulator (oxide) shows crack 213. The via 31 between metal II and metal I suffers from electromigration vias 113. Metal I exhibits metal adhesion problems 215. The contact 32 of metal I to the moat has a bypass due to contact electromigration 114.

Figure 5:
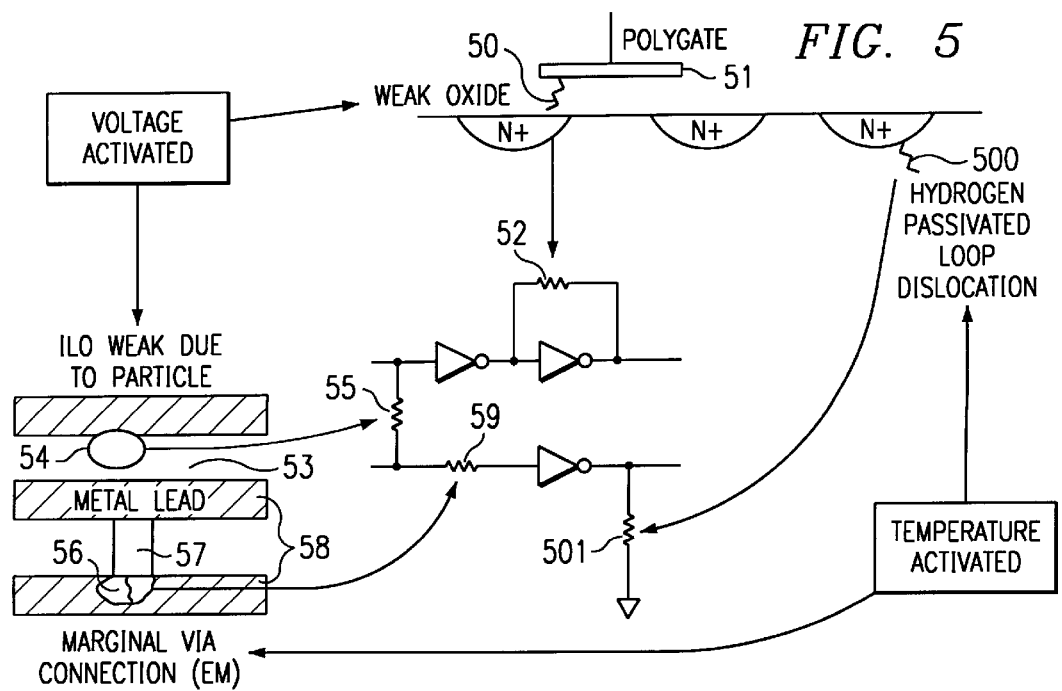
FIG. 5 shows an example of the outlier methodology of the invention as applied to detecting several classes of IC failures.

FIG. 5 illustrates an example of the outlier methodology as applied to detecting IC failures. The voltage activated failures are caught by the high voltage Vdd stress explained above. The temperature activated mechanisms are caught by the low voltage Vdd test explained above, instead of elevated temperature.

Among the high voltage activated failures illustrated in FIG. 5 are a weak oxide 50 under the polysilicon gate 51 causing a high-resistance leakage bypass 52; a weak interlevel oxide 53, affected by a particle 54 and causing a leakage current through a high resistance shunt 55; and a marginal connection 56 of via 57 between two metal layers 58, causing increased resistance 59.

Among the low voltage detected failures illustrated in FIG. 5 are a silicon lattice defect, transformed by a hydrogen passivation process step into a high resistance shunt 501 to ground; and a confirmation of the marginal via connection 56, caused by electromigration.

Tests For Identifying Outlier Wafers

According to the invention, wafers having too many outlier chips are suspect of poor quality and reliability. As mentioned in FIG. 1, specifically wafers with more than 5 to 8% Iddq failures (dependent on the device type) have to be pulled aside. In addition, whenever the distribution of outlier chips on a wafer show peculiarities such as systematic distribution, clustering, or unexpected irregularities, the wafers are also pulled aside. While the failed chips are discarded, the "good" chips are submitted to conventional burn-in after assembly and packaging. Furthermore, the wafers may be subjected to different temperature, testing and assembly programs.

According to the invention, Iddq data comparisons before and after burn-in can reveal a plurality of defects in CMOS devices. Among them are high resistance shunts gate to gate, poly to poly, poly to N-well, metal to metal layer, source to drain, and poly to substrate. The outlier methodology of the invention with its sensitive Iddq tests has proven to be a successful tool for fabrication process improvements.

Tests For Identifying Outlier Wafer Lots

In the summary table of FIG. 1, wafer lots with more than about 25% outlier wafers have to undergo burn-in and special assembly. The percentage is subject to device type.

Test For Identifying Assembly Outliers

As indicated in FIG. 1, the outlier methodology of this invention is applied to the continuity, open and shorts tests after assembly and packaging. The methodology especially identifies bonding processes outside of the process window, bonding failures, and wire sweep in the molding process.

After assembly and packaging of the great majority (approximately 95%) of wafers and chips which have passed the special tests of the outlier methodology of the invention, it is sufficient to test the devices electrically just a single time within their operating specifications and at elevated temperature. It is no longer necessary to submit these devices to the burn-in procedure. Further, it is no longer necessary to test the devices electrically again at low temperature. Obviously, the elimination of these time- and energy-consuming procedures saves significant amounts of money and failure analysis.

Virtual Function Tester Apparatus

An important embodiment of the present invention is the virtual function tester (VFT), an apparatus specifically designed to implement the outlier methodology of this invention. The VTF is shown as a block diagram in FIG. 6. Its main parts are
- the test head, consisting of
  - pin electronics 60 (interface between tester subsystems and device inputs/outputs)
  - dc subsystem 61, including
    - parametric measurement unit 62 and
    - device power supplies; and
  - programmable high-speed clock 64 supporting BIST (built-in self testing); and
- the tester controller 63.

According to the present invention, controller 63 serves as the "virtual" timing, formatting and pattern generating portion of the tester; controller 63 is a computer (desk top, Sparc station) comprising pattern sequence control, pattern memory, scan memory, timing system and driver signal formatter. Controller 63 thus handles in "virtual" fashion those high-speed functions (functional tests based on test patterns, combined with ac parametric tests) which cost in excess of $ 1 million in conventional high-speed testers.

At the present time, the VFT handles devices up to 1024 pins; performs dc tests including continuity, voltage box (Vdd ult min and Vdd ult high), input leakage, and Iddq (240 pA resolution) tests; further performs slow functional, scan, algorithmic, delay fault, and at-speed BIST tests (providing speeds of 800 MHz and higher). Should additional tests be required for future device generations, they can be added without difficulty, since the controller 63 can be loaded with instructions.

Examples of future VFT capabilities include: Higher pin count; parallel testing; analog waveform digitizer and synthesizer; analog "loop-back" stimulus/capture; MemBIST fail capture; and optimized JTAG/scan.

Figure 7:
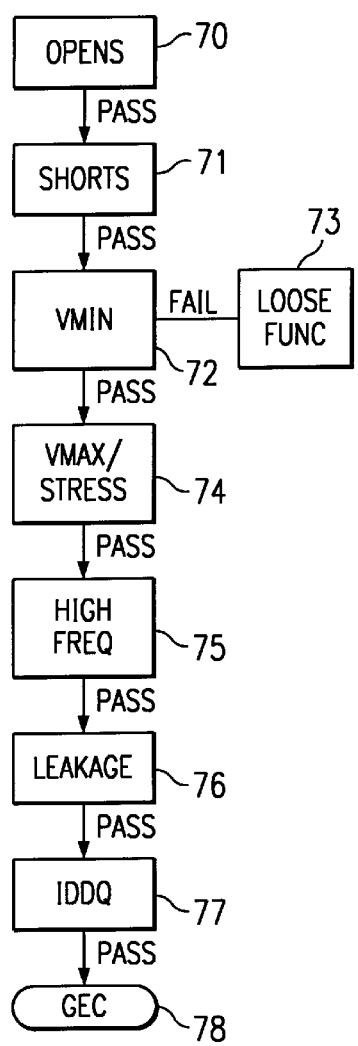
FIG. 7 is an example of a test flow using the VFT and the outlier methodology of the invention.

Based on the VFT apparatus and the outlier methodology of the invention, an example of test flow for a silicon integrated circuit of the digital signal processor family is illustrated in FIG. 7. The test flow is shown at the multiprobe test point for the products which will pass each test. In FIG. 7, after the test 70 for electrical opens and test 71 for electrical shorts, the test 72 for ultra low Vdd is performed, described above. Devices which fail this test are subjected to a low speed functional test 73. Then the ultra high Vdd stress test 74 is performed, described above. The next test 75 involves the high frequency clock described above. The next test 76 for input leakage is followed by test 77 measuring the quiescent current Iddq, described above. Devices 78 which pass all these tests can be classified as "good electrical chips", GEC.

Figure 8:
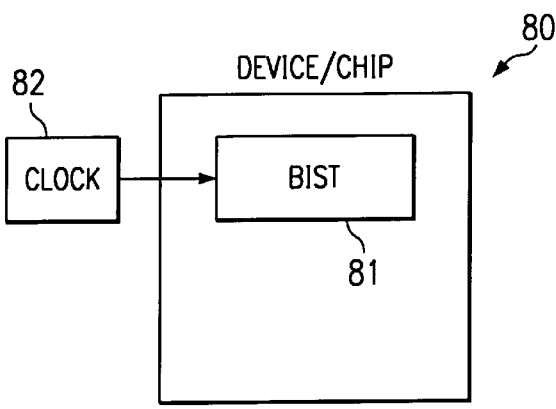
FIG. 8 illustrates schematically the interaction of the VFT with the built-in self-test circuit of the device-under-test using a high-speed clock.

In FIG. 8, the interaction of the VFT with the built-in self-test circuit of the device-under-test using a programmable high-speed clock 82 is schematically illustrated. In this example, the chip, or device, is generally designated 80; it comprises the built-in self testing circuit 81 (BIST) as an integral part. The BIST generates test patterns internally, thus testing the device at its own speed, which, in the example of a digital signal processor product, may work at 800 MHz.

Figure 9:
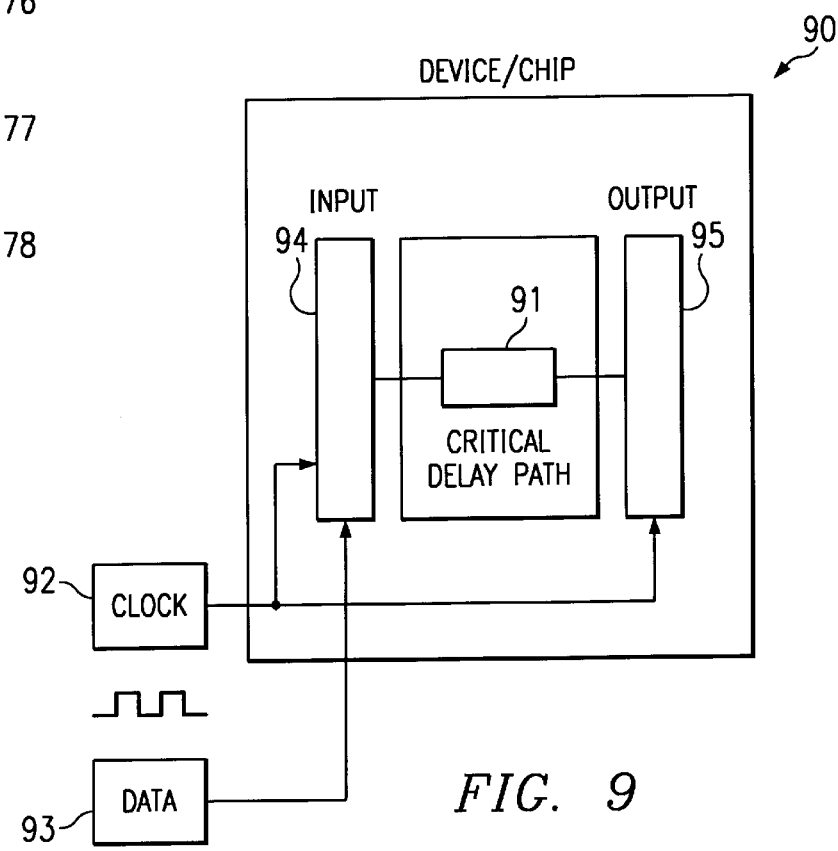
FIG. 9 illustrates schematically the interaction of the VFT with the critical delay path circuit of the device-under-test using a high-speed clock.

In FIG. 9, the interaction of the VFT with the critical delay path circuit 91 of the device-under-test 90 using a programmable high-speed clock 92 is schematically illustrated. First, data 93 is slowly applied to an input test circuit 94. Then, fast bursts from clock 92 (for instance, 2 clock cycles) are supplied to input circuit 94 and output circuit 95 to check the effectiveness of the device critical delay path.

Figure 10:
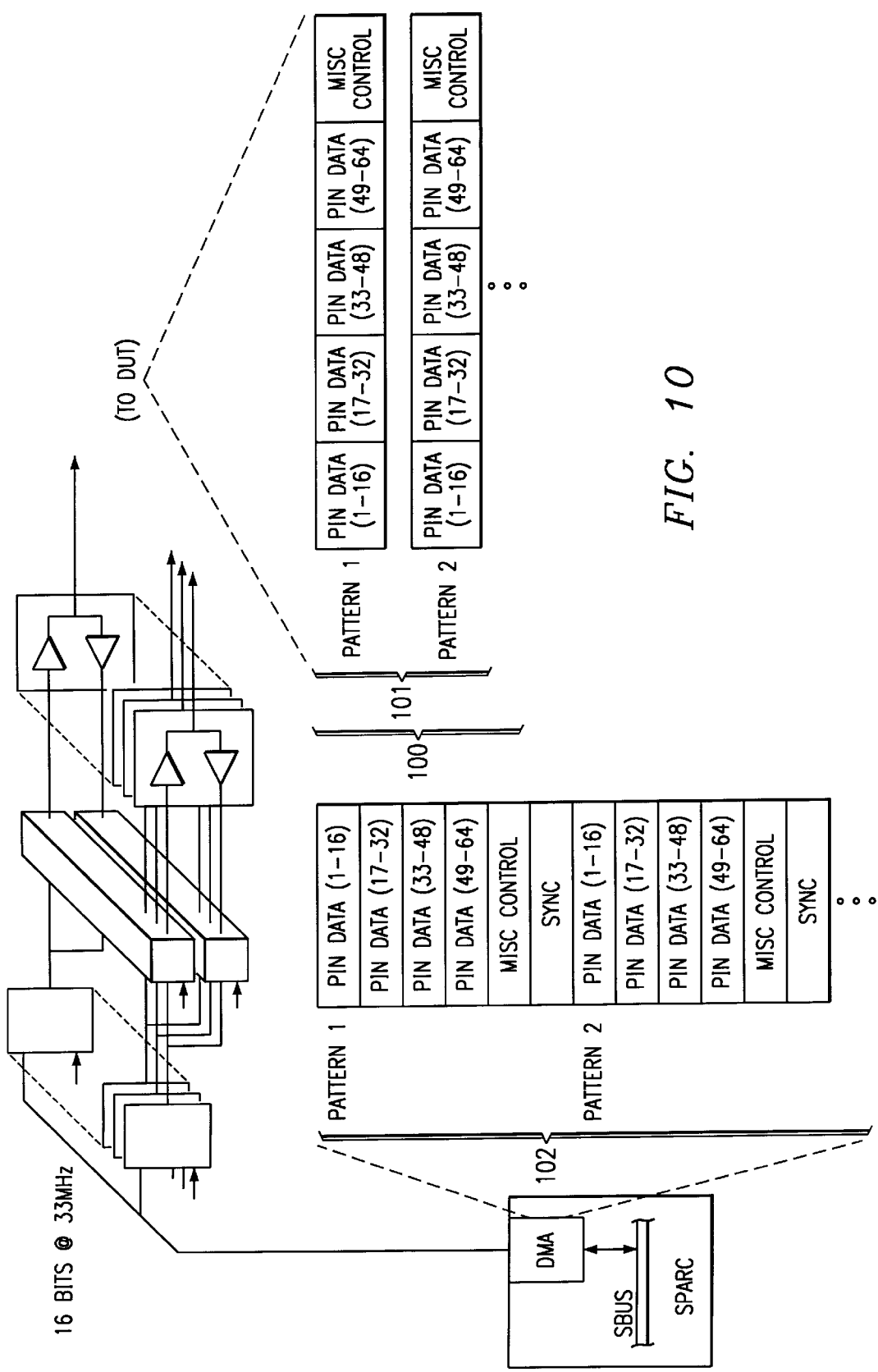
FIG. 10 illustrates the embodiment of the invention for the VFT to generate a virtual parallel patterns/timing by storing and executing a stream of direct-access-memory blocks.

FIG. 10 gives an example how the test patterns, which are stored in the workstation memory as DMA blocks, are transferred to the DUT for digital stimulus and response comparison during testing. Although the pattern data is not transferred "at speed" to the DUT, the use of DMA techniques ensures that the patterns are transferred as efficiently as possible, in order to minimize test time.

In FIG. 10, the DMA data bus is 16 bits wide and operates at 33 MW/s (million words per second). Therefore, all data and control during the pattern execution must be transferred at 33 MHz via the 16 bit DMA bus. If 256 data bits are required to change state (for example, for a 256 pin device), at least 16 DMA words would be required for 1 pattern. Furthermore, some control overhead is required to direct the data bits to the proper device pin groups, and also to accommodate pattern changes beyond simple digital states (for instance, DUT output masking or bi-directional pin control). Therefore, although the DMA transfer rate is 33 MW/s, the effective pattern rate will be slower because of the required data-to-pin mapping and other control. FIG. 10 shows an example of how a traditional parallel pattern can be stored as a 16-bit wide DMA sequence.

In FIG. 10, the traditional parallel pattern is generally designated 100; it is comprised of 64 pins of digital state data, arranged in groups of 16 pins, plus control information, for 2 pattern cycles 101. The same pattern can be stored and executed as a DMA stream, as indicated by 102. The data for each pin group is sequentially updated along with control information, followed by a synchronization cycle. The synchronization cycle is used to update all pattern data simultaneously at the DUT.

The effective pattern execution rate for this example in FIG. 10 would be 33 MHz÷6, or 5.5 MHz. This represents the worst case, in which some data in all pin groups and some control information changes between the two patterns. In actual practice, typical digital patterns are very redundant. Normally only a small percentage of the digital information changes from pattern to pattern. In this case, the DMA stream needs only to store and apply the changes from pattern to pattern, thereby requiring fewer DMA cycles, and therefore allowing faster effective pattern rates.

The pattern execution speed of the VFT is limited. Traditionally, pattern execution speed is used to functionally test devices "at speed". The test methods used in the VFT test strategy generally do not rely on traditional at-speed functional tests. Device performance is verified using at-speed BIST, DFT techniques, internal test structures or other parameter measurements that do not require fast pattern execution.

The limited pattern execution speed causes somewhat extended test time. For a given number of test patterns, the test time will be longer if the pattern execution speed is slower. However, at-speed test pattern execution generally represents a small percentage of the overall test time. Furthermore, as workstation speeds and DMA transfer rates improve, this invention can be scaled for faster test pattern execution, without impacting cost. Also, for minor cost increases, the width of the DMA data path can be increased, resulting in faster pattern execution speed.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method for assuring quality and reliability of semiconductor integrated circuit devices, fabricated by a series of documented process steps, comprising:

electrically testing said devices outside their specified operating voltage range, yet within the capabilities of the structures produced by said process steps, thereby generating raw electrical test data;

comparing said test data to values expected from the design of said devices, thereby providing non-electrical characterization of said devices to verify compositional and structural features; and correlating said features with said documented process steps to find deviations therefrom, as well as structural defects, thereby identifying outlier devices.

2. The method according to claim 1 wherein said testing comprises:

inputting test voltages higher than specification at input terminals selected on circuit design;

measuring quiescent leakage current; and correlating said leakage current with pre-defined limits, thereby finding devices with leakage current higher than the pre-defined limits as reason for rejection.

3. The method according to claim 2 further comprising the steps of stressing said devices and repeating the measurement of said leakage current, thereby detecting any difference between first and second leakage, causing said devices to be rejected.

4. The method according to claim 2 further comprising the step of repeating the measurement of said leakage current at different logic state of said devices, thereby detecting any difference between first and second leakage, causing said devices to undergo distribution testing and potential rejection.

5. The method according to claim 1 wherein said testing comprises:

inputting test voltages lower than specification at input terminals selected on circuit design;

measuring quiescent leakage current; and correlating said leakage current with pre-defined limits, thereby finding devices with leakage current higher than the pre-defined limits as reason for rejection.

6. The method according to claim 1 wherein said testing comprises:

inputting test voltages in a voltage range at least as great as the specified input voltage range at input terminals selected on circuit design; measuring output voltages at selected output terminals to determine state of said circuit at output.

7. The method according to claim 6 wherein said voltage range is determined by said capabilities of said process steps used for fabricating said semiconductor devices.

8. The method according to claim 6 wherein said voltage range includes higher as well as lower voltages than defined by device specification.

9. The method according to claim 1 wherein said testing comprises:

inputting a high test voltage, the high test voltage near the device's specified maximum input voltage and measuring quiescent leakage current;

inputting a low test voltage, the low test voltage near the device's specified minimum input voltage and measuring quiescent leakage current; and interpolating the data for determining a linear relation as reason for rejection.

10. The method according to claim 1 wherein said testing comprises:

measuring input leakage current;

correlating said leakage current with pre-defined limits set lower than specification, thereby finding devices with leakage current higher than pre-defined limits as reason for rejection.

11. The method according to claim 1 wherein said testing comprises:

measuring electrical parameters related to process parameters having low Cpk;

correlating said electrical parameters with pre-defined limits, thereby finding outlier devices with potential for rejection.

12. The method according to claim 1 wherein said electrical testing is performed at ambient temperature.

13. The method according to claim 1 wherein said testing eliminates the need for burn-in of all said circuits which pass said testing and correlating.

14. The method according to claim 1 wherein said testing results in devices having a voltage margin of ±25%.

15. The method according to claim 1 wherein said electrical testing excludes functional tests at the device's rated operating speed.

16. The method according to claim 1 wherein said electrical testing excludes functional tests at 400 megahertz.

17. The method according to claim 1 wherein said testing comprises:

measuring electrical parameters related to process parameters having Cpk below about 1.5;

correlating said electrical parameters with pre-defined limits, thereby finding outlier devices with potential for rejection.

18. The method according to claim 1 wherein said testing comprises:

measuring electrical parameters related to process parameters having Cpk below 2;

correlating said electrical parameters with pre-defined limits, thereby finding outlier devices with potential for rejection.

* * * * *